United States Patent
Tsai et al.

(10) Patent No.: US 9,105,537 B2
(45) Date of Patent: Aug. 11, 2015

(54) MULTI-JUNCTION PHOTODIODE IN APPLICATION OF MOLECULAR DETECTION AND DISCRIMINATION, AND METHOD FOR FABRICATING THE SAME

(75) Inventors: Chiun-Lung Tsai, New Taipei (TW); Jui-Feng Huang, Hsinchu (TW); Ming-Fang Hsu, Hsinchu County (TW); Chih-Yang Chen, New Taipei (TW)

(73) Assignee: Personal Genomics, Inc., Grand Cayman (KY)

( * ) Notice: Subject to any disclaimer, the term of this patent is extended or adjusted under 35 U.S.C. 154(b) by 585 days.

(21) Appl. No.: 13/444,809

(22) Filed: Apr. 11, 2012

(65) Prior Publication Data

US 2013/0105945 A1    May 2, 2013

(30) Foreign Application Priority Data

Oct. 28, 2011  (TW) .............................. 100139395 A

(51) Int. Cl.
| H01L 21/8234 | (2006.01) |
| H01L 29/02 | (2006.01) |
| H01L 21/336 | (2006.01) |
| H01L 27/146 | (2006.01) |

(52) U.S. Cl.
CPC ...... *H01L 27/14607* (2013.01); *H01L 27/1461* (2013.01); *H01L 27/1463* (2013.01); *H01L 27/14647* (2013.01); *H01L 27/14689* (2013.01)

(58) Field of Classification Search
None
See application file for complete search history.

(56) References Cited

U.S. PATENT DOCUMENTS

| 5,539,301 | A  * | 7/1996 | Uebele .......................... 323/282 |
| 6,727,521 | B2 | 4/2004 | Merrill |
| 6,841,816 | B2 | 1/2005 | Merrill et al. |
| 6,960,757 | B2 | 11/2005 | Merrill et al. |
| 7,132,724 | B1 | 11/2006 | Merrill |
| 7,339,216 | B1 * | 3/2008 | Lyon et al. ..................... 257/291 |
| 7,470,946 | B2 | 12/2008 | Hsu et al. |
| 7,651,883 | B2 | 1/2010 | Lee et al. |
| 2007/0218613 | A1 * | 9/2007 | Lee et al. ..................... 438/197 |
| 2008/0277701 | A1 | 11/2008 | Lee et al. |
| 2009/0194799 | A1 * | 8/2009 | Lee et al. ..................... 257/292 |

FOREIGN PATENT DOCUMENTS

| CN | 1938856 | 3/2007 |
| CN | 101207147 | 6/2008 |

OTHER PUBLICATIONS

"Office Action of Chinese Counterpart Application", issued on Jan. 12, 2015, p. 1-p. 6.

* cited by examiner

*Primary Examiner* — Mark Tornow
*Assistant Examiner* — Priya Rampersaud
(74) *Attorney, Agent, or Firm* — Jianq Chyun IP Office

(57) ABSTRACT

A multi-junction photodiode for molecular detection and discrimination and fabrication methods thereof. The multi junction photodiode includes a substrate having first conductive type dopants, an epitaxial layer having the first conductive type dopants, a deep well having second conductive type dopants, a first well having the first conductive type dopants, a second well having the second conductive type dopants, a third well having the first conductive type dopants, and a first doped region having the second conductive type dopants. The epitaxial layer is disposed on the substrate. The deep well is disposed in the epitaxial layer. The first well having three sides connected to the epitaxial layer is disposed in the deep well. The second well is disposed in the first well. The third well having three sides connected to the epitaxial layer is disposed in the second well. The first doped region is disposed in the third well.

26 Claims, 11 Drawing Sheets

US 9,105,537 B2

MULTI-JUNCTION PHOTODIODE IN APPLICATION OF MOLECULAR DETECTION AND DISCRIMINATION, AND METHOD FOR FABRICATING THE SAME

CROSS-REFERENCE TO RELATED APPLICATION

This application claims the priority benefit of Taiwan application serial no. 100139395, filed on Oct. 28, 2011. The entirety of the above-mentioned patent application is hereby incorporated by reference herein and made a part of this specification.

BACKGROUND OF THE INVENTION

1. Field of the Invention

The present application relates to a semiconductor structure and a manufacturing method thereof. More particularly, the present application relates to a photodiode array compatible with the CMOS manufacturing processes and the manufacturing method thereof.

2. Description of Related Art

Complementary metal oxide semiconductor (CMOS) image sensor (also called CIS) can be fabricated using the processes compatible with CMOS logic device manufacturing processes and can be easily integrated with peripheral circuits on the same chip, thus significantly reducing the costs and lowering the power of the image sensor. In recent years, CMOS image sensors become increasingly notable as CMOS image sensors have been widely applied for image display applications, including, but not limited to, alarm systems, surveillance systems, industrial monitoring and biochemical detection, etc. However, the conventional CMOS image sensors are limited by the use of color filter and unsuitable for high sensitivity applications.

U.S. Pat. No. 6,727,521 discloses a vertical color filter pixel sensor applicable for image sensors. As shown in its FIGS. 1 and 3, the multi junction structure demonstrates different quantum efficiency in the photodiodes disposed at different depth for blue, green and red light. However, the manufacturing processes of this structure are complicated and require two additional silicon epitaxy processes and a plurality of ion implantation processes. In FIG. 3, the first epitaxy process (66) is formed between the red and green diodes. The second epitaxy process (72) is formed between the blue and green diodes. As no isolation exists between the diodes, there is concern that the spatial resolution would be lowered. In addition, the two additional silicon epitaxy processes also increase the production costs.

In FIG. 2B of U.S. Pat. No. 7,470,946, the blue light detection region is denoted 202, the green light detection region is denoted 204 and the red light detection region is denoted 206. However, the silicon on insulator (SOI) technology, which is still in its infant stage, is employed, leading to low yield.

U.S. Pat. No. 6,841,816 describes a method of forming a vertical color filter sensor on the silicon substrate. In its FIG. 12, a cross-sectional view of a single sensor is illustrated. Silicon dioxide is used between the sensors to prevent the carrier diffusion from the adjacent sensors, so as to avoid cross-talk. In addition, the arsenic ion is implanted with a voltage of 1200 keV to form the junction in a depth of 1 μm, which is not commonly used condition for the conventional semiconductor processes. The formation of the extra silicon dioxide insulating layers further complicates the manufacturing processes. The interface of the epitaxy layer is located between the multi junction diodes, which leads to the increase of dark currents and the reduction of the quantum efficiency.

U.S. Pat. No. 7,651,883 discloses using the U-shaped well regions surrounding each multi junction photodiode to avoid the reduction of the spatial resolution by preventing the carriers diffusing into the adjacent photodiodes. The photodiodes are fabricated directly on the n type silicon substrate without the needs of the epitaxy layer. Although the U-shaped well regions solves the spatial resolution problem owing to the lack of outer isolation as described in U.S. Pat. No. 6,960,757, the formation of the U-shaped well surrounding the multi junction structure in this article employs high-energy ion implantation processes. Furthermore, the n type substrate used in this article is not compatible with the CMOS logic processes used in the semiconductor industry, thus not suitable for mass production in foundries. In addition, emphasized in this patent that the multi junction structure is formed directly on the substrate without the need of epitaxy layers on the substrate, the leakage current could be larger due to defects in the substrate and awkward substrate planarity.

SUMMARY OF THE INVENTION

The present application is directed to a semiconductor device of the multi junction photodiode(s).

The present invention also provides a manufacturing method of the semiconductor device compatible with the CMOS logic processes.

In the present application, a semiconductor device is provided, including a substrate having first conductive type dopants, an epitaxy layer having the first conductive type dopants; a deep well region having second conductive type dopants, a first well region having the first conductive type dopants, a second well region having the second conductive type dopants, a third well region having the first conductive type dopants and a first doped region having the second conductive type dopants. The epitaxy layer is disposed on the substrate, and the deep well region is disposed in the epitaxy layer. The first well region is disposed in the deep well region, and three sides of the first well region are in contact with the epitaxy layer. The second well region is disposed in the first well region. The third well region is disposed in the second well region, and three sides of the third well region are in contact with the epitaxy layer. The first doped region is disposed in the third well region.

In the present application, a semiconductor device is provided, including a substrate having first conductive type dopants, an epitaxy layer having the first conductive type dopants; a deep well region having second conductive type dopants, a first layer region and a second layer region having the first conductive type dopants, at least a third layer region having the first conductive type dopants, a fourth layer region having the first conductive type dopants, and an optional first doped region having the second conductive type dopants. The epitaxy layer is disposed on the substrate, and the deep well region is disposed in the epitaxy layer. The first and second layer regions are disposed in the deep well region, and three sides of the first and second layer regions are respectively in contact with the epitaxy layer. The second layer region is located above and unconnected to the first layer region. The third layer region is disposed in the deep well region, and the third layer region is located above the first layer region to connect the first layer region to the top surface of the epitaxy layer. The fourth layer region is disposed in the deep well region, and the fourth layer region is located above the second layer region to connect the second layer region to the top surface of the epitaxy layer. The first doped region having the second conductive type dopants is optionally formed at the top.

In the present application, a semiconductor device is provided, including a substrate having first conductive type dopants, an epitaxy layer having the first conductive type dopants; a deep well region having second conductive type dopants, a first layer region having the first conductive type dopants, at least a second layer region having the first conductive type dopants, a first well region having the first conductive type dopants and a first doped region having the second conductive type dopants. The epitaxy layer is disposed on the substrate, and the deep well region is disposed in the epitaxy layer. The first layer region is disposed in the deep well region, and three sides of the first layer region are in contact with the epitaxy layer. The second layer region is disposed in the deep well region. The second layer region is located above the first layer region to connect the first layer region to the top surface of the epitaxy layer. The first well region is disposed in the deep well region. The first well region is located above and unconnected to the first layer region, and three sides of the first well region are in contact with the epitaxy layer. The first doped region is disposed in the first well region.

In the present application, a fabrication method of a semiconductor device is also provided. In the fabrication method, a substrate having first conductive type dopants is provided. An epitaxy layer having the first conductive type dopants is formed on the substrate, and a deep well region having second conductive type dopants is formed in the epitaxy layer. A first well region having the first conductive type dopants is formed in the deep well region, wherein three sides of the first well region are in contact with the epitaxy layer. A second well region having the second conductive type dopants is formed in the first well region. A third well region having the first conductive type dopants is formed in the second well region, wherein three sides of the third well region are in contact with the epitaxy layer. A first doped region having the second conductive type dopants is formed in the third well region.

In the present application, a fabrication method of a semiconductor device is also provided. In the fabrication method, a substrate having first conductive type dopants is provided. An epitaxy layer having the first conductive type dopants is formed on the substrate, and a deep well region having second conductive type dopants is formed in the epitaxy layer. A first layer region and a second layer region having the first conductive type dopants are formed in the deep well region, wherein the second layer region is formed above and unconnected with the first layer region, three sides of the first layer region and three sides of the second layer region are respectively in contact with the epitaxy layer. At least a third layer region having the first conductive type dopants is formed in the deep well region, wherein the third layer region is formed above the first layer region to connect the first layer region to the top surface of the epitaxy layer. A fourth layer region having the first conductive type dopants is formed in the deep well region, wherein the fourth layer region is formed above the second layer region to connect the second layer region to the top surface of the epitaxy layer. A first doped region having the second conductive type dopants is optionally formed at the top.

In the present application, a fabrication method of a semiconductor device is also provided. In the fabrication method, a substrate having first conductive type dopants is provided. An epitaxy layer having the first conductive type dopants is formed on the substrate, and a deep well region having second conductive type dopants is formed in the epitaxy layer. A first layer region having the first conductive type dopants is formed in the deep well region, wherein three sides of the first layer region are in contact with the epitaxy layer. At least a second layer region having the first conductive type dopants is formed in the deep well region, wherein the second layer region is formed above the first layer region to connect the first layer region to the top surface of the epitaxy layer. A first well region having the first conductive type dopants is formed in the deep well region, wherein the first well region is formed above and unconnected with the first layer region, and three sides of the first well region are in contact with the epitaxy layer. A first doped region having the second conductive type dopants is formed in the first well region.

By depositing the well regions and the doped regions in the epitaxy layer, the multi junction photodiode, the semiconductor device of this invention, is formed. The semiconductor device has the characteristics of low dark current, high sensitivity, and capability of detecting light of various wavelength. Furthermore, the fabrication processes of the semiconductor device of this invention can be integrated with the current CMOS logic processes, so that the multi junction photodiodes can be formed with the CMOS logic devices at the same time, thus simplifying the fabrication without significantly increasing the production costs.

In order to make the above and other features and advantages of the present invention more comprehensible, embodiments accompanied with figures are described in details below.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DESCRIPTION OF EMBODIMENTS

The semiconductor device of this invention is, for example, a multi junction photodiode, and a plurality of multi junction photodiode structures are arranged in an array on the substrate. In general, through the design of specific stacked structures, various depth of the junction structures and modifying the doping concentration of the junctions/layers, the multi junction photodiode is formed with at least the following capabilities: (1) capability of discriminating light of various wavelength, (2) high detection sensitivity and (3) low noise (such as low dark currents). In addition, due to the design of the multi-junction, the photodiode of this invention when applied in the CMOS image sensors can discriminate light of various wavelength, useful for the assortment of sensing wavelength for the conventional CMOS image sensor, enhancing the detection sensitivity and reducing the dark currents. Hence, such highly sensitive sensor can be widely used in various detection applications, including molecular detection and discrimination.

Later on, cross-sectional views are provided to illustrate the embodiments of this invention. It is noted that p type is the first conductive type and n type is the second conductive type in the following embodiment(s). However, such design is not meant to limit the scope of the present invention. It is also feasible to assign the first conductive type as the n type and the second conductive type as the p type to form the semiconductor device of this invention.

First Embodiment

Figure 1A:
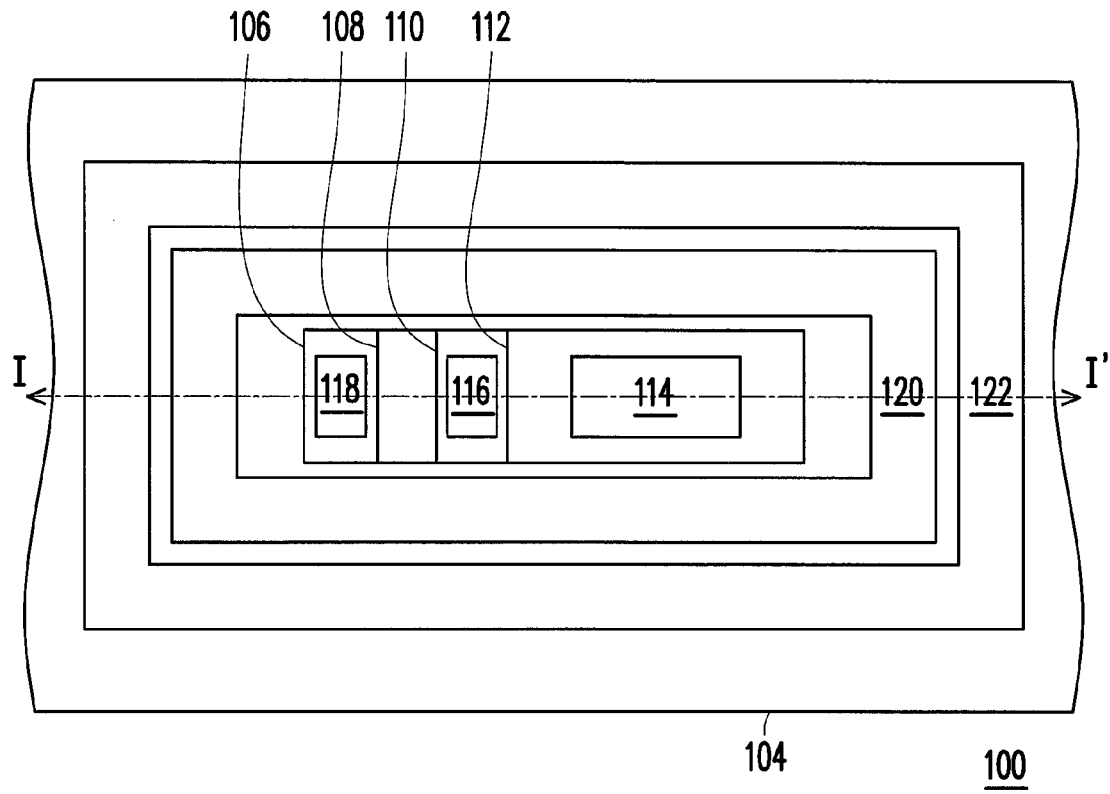
FIG. 1A is a schematic top view of the semiconductor device of this invention according to the first embodiment.
Figure 1B:
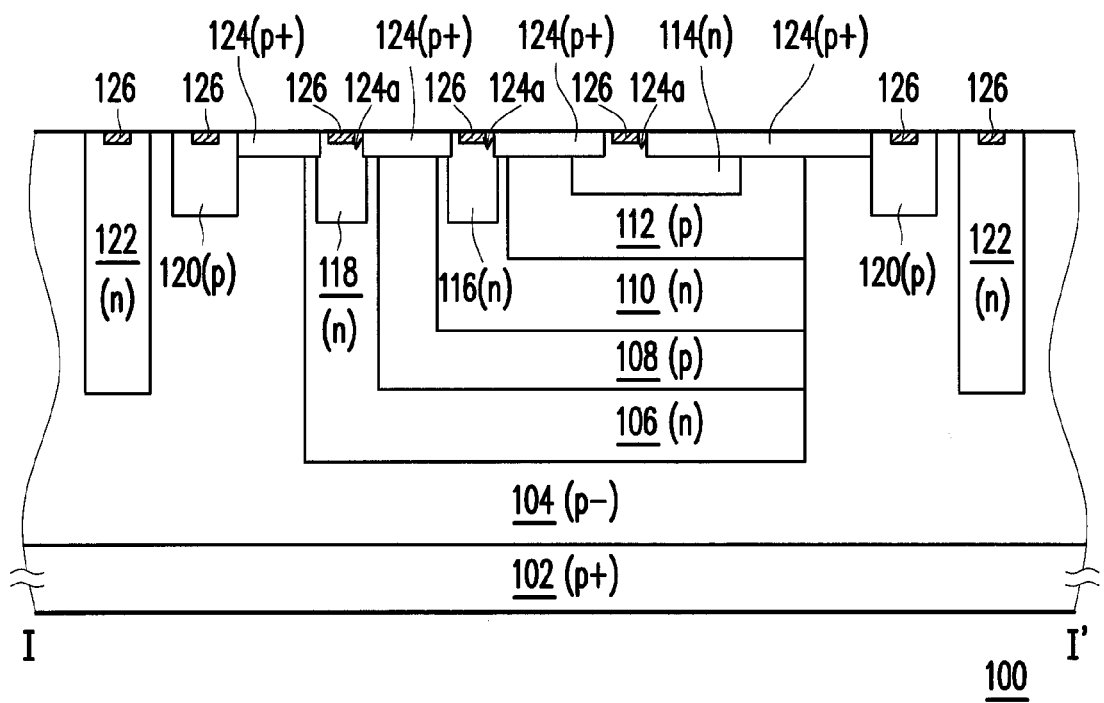
FIG. 1B is a cross-sectional view of FIG. 1A along the line I-I'.

FIG. 1A is a schematic top view of the semiconductor device of this invention according to the first embodiment. FIG. 1B is a cross-sectional view of FIG. 1A along the line I-I'. For description purposes, merely the main layout of the photodiode is illustrated in FIG. 1A, while certain elements may be omitted for the convenience of explanation.

Referring to FIGS. 1A and 1B, the semiconductor device 100 is, for example, a multi junction photodiode for detecting light of various wavelength. The semiconductor device 100 includes a substrate 102 having the first conductive type dopants, an epitaxy layer 104 having the first conductive type dopants, a deep well region 106 having the second conductive type dopants, a well region 108 having the first conductive type dopants, a well region 110 having the second conductive type dopants, a well region 112 having the first conductive type dopants and a doped region 114 having the second conductive type dopants.

The substrate 102 having the first conductive type dopants is, for example, a p+ type substrate (p+ sub), which is a silicon substrate or other semiconductor substrate. In the first embodiment, the implanted dopants in the p+ type substrate 102 are boron, with a doping concentration, for example, of about $1\times10^{19}$ atoms/cm$^3$~$1\times10^{21}$ atoms/cm$^3$.

The epitaxy layer 104 having the first conductive type dopants is disposed on the substrate 102. The epitaxy layer 104 is, for example, a p– type lightly doped epitaxy silicon layer (epi p–). In the first embodiment, the implanted dopants in the p– type epitaxy layer 104 are boron, with a doping concentration, for example, of about $1\times10^{15}$ atoms/cm$^3$~$5\times10^{16}$ atoms/cm$^3$. In addition, the epitaxy layer 104 grown on the substrate 102 has a thickness of about 4 μm~7 μm, for example.

The deep well region 106 having the second conductive type dopants is disposed in the epitaxy layer 104 and is, for example, an n type deep well region. In the first embodiment, the implanted dopants in the n type deep well region 106 are phosphorus, with a doping concentration, for example, of about $1\times10^{16}$ atoms/cm$^3$~$1\times10^{17}$ atoms/cm$^3$. In addition, the deep well region 106 has a distribution range from the top surface of the epitaxy layer 104 extending down to a depth of about 3 μm~4.5 μm.

The well region 108 having the first conductive type dopants is disposed in the deep well region 106 and is, for example, a p type well region. In the first embodiment, the implanted dopants in the p type well region 108 are boron, with a doping concentration, for example, of about $5\times10^{16}$ atoms/cm$^3$ to $8\times10^{17}$ atoms/cm$^3$. In addition, the well region 108 has a distribution range from the top surface of the epitaxy layer 104 extending down to a depth of about 2.5 μm to 3.2 μm, and three sides are in contact with the epitaxy layer.

The well region 110 having the second conductive type dopants is disposed in the well region 108 and is, for example, an n type well region. In the first embodiment, the dopants implanted in the n type well region 110 are phosphorus, with a doping concentration, for example, of about $1\times10^{16}$ atoms/cm$^3$ to $1\times10^{17}$ atoms/cm$^3$. In addition, the well region 110 has a distribution range from the top surface of the epitaxy layer 104 extending down to a depth of about 1.8 μm to 2.3 μm.

The well region 112 having the first conductive type dopants is disposed in the well region 110 and three sides of the well region 112 are in contact with the epitaxy layer. The well region 112, is, for example, a p type well region. In the first embodiment, the dopants implanted in the p type well region 112 are boron, with a doping concentration, for example, of about $5\times10^{16}$ atoms/cm$^3$ to $8\times10^{17}$ atoms/cm$^3$. In addition, the well region 112 has a distribution range from the top surface of the epitaxy layer 104 extending down to a depth of about 1.2 μm to 1.7 μm.

The doped region 114 having the second conductive type dopants is disposed in the well region 112 and is, for example, an n type doped region. In the first embodiment, the dopants implanted in the n type doped region 114 are phosphorus, with a doping concentration, for example, of about $1\times10^{16}$ atoms/cm$^3$ to $1\times10^{17}$ atoms/cm$^3$. In addition, the doped region 114 has a distribution range from the top surface of the epitaxy layer 104 extending down to a depth of about 0.5 μm to 0.8 μm.

In the first embodiment, as shown in FIGS. 1A and 1B, in the 3D point of view, the three sides of the well region 108 are, for example, in contact with the epitaxy layer 104, the deep well region 106 forms an L-shaped structure; the three sides of the well region 112 are, for example, in contact with the epitaxy layer 104 and the well region 110 forms an L-shaped structure. The L-shaped structures of the above deep well region 106 and the well region 110 can be rotated to any angle along the axis of epitaxy depth, and are not limited to the direction specified in FIGS. 1A and 1B. Because there are plural p-n junctions formed between the epitaxy layer 104, the deep well region 106, the well region 108, the well region 110, the well region 112 and the doped region 114, a multi junction photodiode structure is obtained, which is capable of sensing light of various wavelength.

Different light wavelengths have different penetration depths in the silicon substrate. For example, the penetration depth is 0.91 μm for light wavelength of 500 nm, 2.42 μm for wavelength of 600 nm, and 5.26 μm for wavelength of 700 nm. Therefore, the multi junction photodiode fabricated by the general CMOS logic processes in combination with the back-end circuit design can achieve multiple wavelength detection based on the light absorption properties of silicon.

Specifically speaking, in the semiconductor device 100, the doped region 114 surrounded by the well region 112 forms the first photodiode, the L-shaped region 110 surrounded by the epitaxy layer 104, the well region 108 and the well region 112 forms the second photodiode, and the L-shaped deep well region 106 surrounded by the epitaxy layer 104, the well region 108 forms the third photodiode. That is, the multi junction photodiode structure constituted by the doped region 114, the well region 112, the well region 110, the well region 108, the deep well region 106 and the epitaxy layer 104 can detect the short wavelength of about 450 nm to 550 nm, the middle wavelength of about 550 nm to 650 nm and the long wavelength of about 650 nm to 800 nm respectively in the first, second, and third junction, thus improving the sensitivity, when compared with conventional CMOS image sensor using the color filter.

In order to increase the conductivity of the photodiode, within the well region 110 having the second conductive type dopants, the well region 116 of the same conductive type is optionally set, and within the deep well region 106 having the second conductive type dopants, the well region 118 of the same conductive type is optionally set. The well region 116 having the second conductive type dopants is, for example, an n type well region. The doping concentration of the well region 116 is higher than that of the well region 110, so as to function as the terminal of the well region 110 for outer connection. In the first embodiment, the dopants implanted in the n type well region 116 are phosphorus, with a doping concentration, for example, of about $5\times10^{16}$ atoms/cm$^3$ to $5\times10^{17}$ atoms/cm$^3$. In addition, the well region 116 has a distribution range from the top surface of the epitaxy layer 104 extending down to a depth of about 0.5 µm~1.5 µm.

The well region 118 having the second conductive type dopants is, for example, an n type well region. The doping concentration of the well region 118 is higher than that of the deep well region 106, so as to function as the terminal of the deep well region 106 for outer connection. In the first embodiment, the dopants implanted in the n type well region 118 are phosphorus, with a doping concentration, for example, of about $5\times10^{16}$ atoms/cm$^3$ to $5\times10^{17}$ atoms/cm$^3$. In addition, the well region 118 has a distribution range from the top surface of the epitaxy layer 104 extending down to a depth of about 1.5 µm to 2.5 µm.

In addition, in the first embodiment, the well region 120 having the first conductive type dopants is optionally set in the semiconductor device 100 for the reference voltage. Optionally, the well region 122 having the second conductive type dopants and the doped region 124 having the first conductive type dopants may be set. The well region 120 and the well region 122 are set in the epitaxy layer 104, for example, outside the edge of the deep well region 106, while the doped region 124 is, for example, disposed on top of the deep well region 106.

In details, the well region 120 having the first conductive type dopants is, for example, a p type well region. The well region 120 is, for example, ring-shaped surrounding without contacting with the deep well region 106. In the first embodiment, the dopants implanted in the p type well region 120 are boron, with a doping concentration, for example, of about $1\times10^{17}$ atoms/cm$^3$ to $8\times10^{17}$ atoms/cm$^3$. In addition, the well region 120 has a distribution range from the top surface of the epitaxy layer 104 extending down to a depth of about 1.0 µm to 2.0 µm.

The well region 122 having the second conductive type dopants is, for example, an n type well region. The well region 122 is, for example, ring-shaped surrounding but without contacting with the well region 120. In the first embodiment, the dopants implanted in the n type well region 122 are phosphorus, with a doping concentration, for example, of about $1\times10^{17}$ atoms/cm$^3$ to $8\times10^{17}$ atoms/cm$^3$. In addition, the well region 120 has a distribution range from the top surface of the epitaxy layer 104 extending down to a depth of about 2 µm to 4 µm.

The doped region 124 having the first conductive type dopants is, for example, a p type (p+) doped region. The doped region 124 is, for example, located within the area defined by the ring-shaped well region 120, and spans over the whole area of the deep well region 106. The doped region 124 is disposed on the deep well region 106, the well region 108, the well region 110, the well region 112, the doped region 114, the well region 116 and the well region 118. In the first embodiment, the dopants implanted in the p type doped region 124 are boron, with a doping concentration, for example, of about $1\times10^{18}$ atoms/cm$^3$ to $1\times10^{21}$ atoms/cm$^3$. In addition, the doped region 124 has a distribution range from the top surface of the epitaxy layer 104 extending down to a depth of about 0.2 µm to 0.5 µm.

Because there are the well region 120, the well region 122 and the doped region 124 of higher doping concentrations surrounding the periphery of the photodiode, the well region 120 and the well region 122 can avoid noise impact from outer circuits and cross-talk from the adjacent photodiodes, and lower the internal dark current of the photodiode. The doped region 124 can avoid carrier diffusion to the outside, and lower the dark current by isolating the surface defects resulting from the processes. Hence, through the design of the well region 120, the well region 122 and the doped region 124, the device efficiency is enhanced by reducing noises, blocking the leaking current, and lowering the dark currents.

In the first embodiment, the semiconductor device 100 further includes a plurality of contacts, respectively disposed on the doped region 114, the well region 116, the well region 118, the well region 120 and the well region 122, for electrically connecting to the outer circuits. The material of the contact 126 is, for example, a metal or other conductive materials, or the contact 126 is a heavily doped region. In this embodiment, when the semiconductor device 100 has the doped region 124 spanning over the whole deep well region 106, the doped region 124 further includes a plurality of openings 124a, disposed on the doped region 114, the well region 116, the well region 118, to facilitate the formation of the contacts 126.

Second Embodiment

Figure 2:
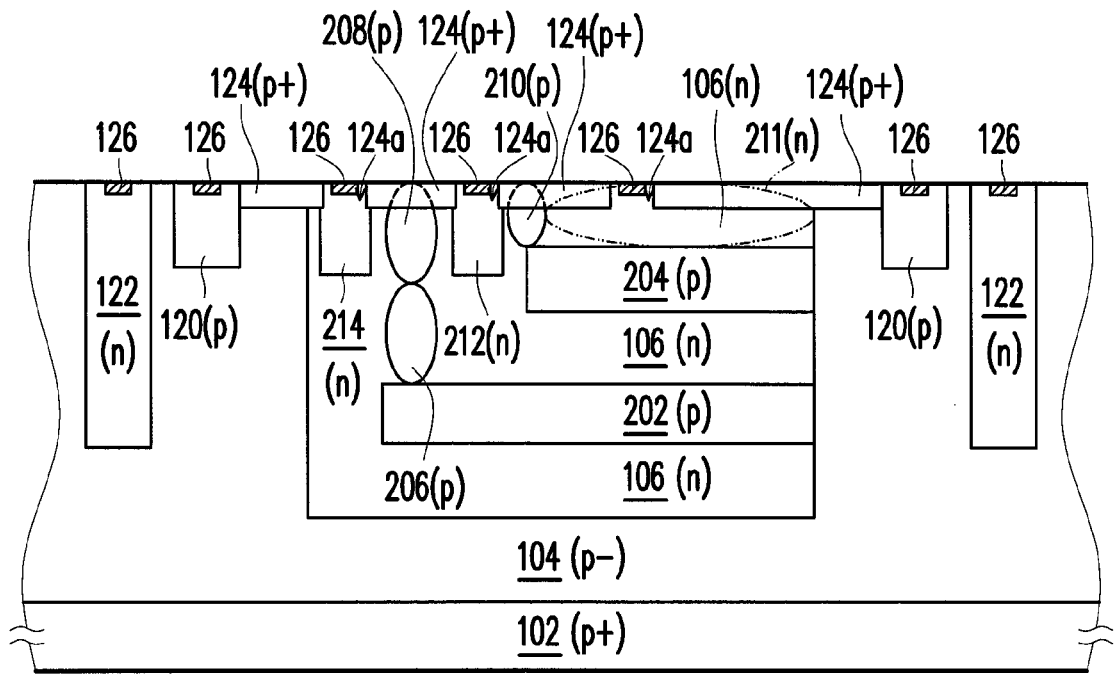
FIG. 2 is a schematic cross-sectional view of the semiconductor device of this invention according to the second embodiment.

FIG. 2 is a schematic cross-sectional view of the semiconductor device of this invention according to the second embodiment. In FIG. 2, the same elements used in FIG. 1B are designated with the same reference numbers, and the detailed descriptions may be omitted.

Referring to FIG. 2, the semiconductor device 200 is, for example, a multi junction photodiode for detecting light of various wavelength. The main elements of the semiconductor device 200 of FIG. 2 are substantially similar to those elements of the semiconductor device 100 of FIGS. 1A and 1B, while the differences mainly lie in the arrangement of the photodiode. The semiconductor device 200 includes the substrate 102 having the first conductive type dopants, the epitaxy layer 104 having the first conductive type dopants, the deep well region 106 having the second conductive type dopants, the layer region 202 having the first conductive type dopants, the layer region 204 having the first conductive type dopants, the layer region 206 having the first conductive type dopants, the layer region 208 having the first conductive type dopants and the layer region 210 having the first conductive type dopants.

The layer region 202 having the first conductive type dopants is disposed in the deep well region 106 and is, for example, a p type layer region. In the first embodiment, the dopants implanted in the p type region 202 are boron, with a doping concentration, for example, of about $5 \times 10^{16}$ atoms/cm$^3$ to $8 \times 10^{17}$ atoms/cm$^3$. In addition, the layer region 202 has a distribution range from a depth below the top surface of the epitaxy layer 104 of about 1.8 µm to 2.3 µm to a depth below the top surface of the epitaxy layer 104 of about 2.5 µm to 3.2 µm.

The layer region 204 having the first conductive type dopants is disposed in the deep well region 106 and is, for example, a p type layer region. The layer region 204 is disposed above the layer region 202, but the layer region 204 and the layer region 202 are, for example, unconnected to each other. In the second embodiment, the dopants implanted in the p type region 204 are boron, with a doping concentration, for example, of about $5 \times 10^{16}$ atoms/cm$^3$ to $8 \times 10^{17}$ atoms/cm$^3$. In addition, the layer region 204 has a distribution range from a depth below the top surface of the epitaxy layer 104 of about 0.5 µm to 0.8 µm to a depth below the top surface of the epitaxy layer 104 of about 1.2 µm to 1.7 µm.

The layer region 206 and the layer region 208 having the first conductive type dopants are disposed in the deep well region 106 and are, for example, p type layer regions. The layer region 206 and the layer region 208 are located above the layer region 202, and the layer region 206 is located between the layer region 208 and the layer region 202. The layer region 208, the layer region 206 and the layer region 202 are, for example, connected, so that the layer region 208 and the layer region 206 form an upright structure to connect the layer region 202 to the top surface of the epitaxy layer 104. In the second embodiment, the dopants implanted in the p type layer region 206 and the layer region 208 are boron, with a doping concentration, for example, of about $5 \times 10^{16}$ atoms/cm$^3$ to $8 \times 10^{17}$ atoms/cm$^3$. In addition, the layer region 206 has a distribution range from a depth below the top surface of the epitaxy layer 104 of about 1.2 µm to 1.7 µm to a depth below the top surface of the epitaxy layer 104 of about 1.8 µm to 2.3 µm, and the layer region 208 has a distribution range from the top surface of the epitaxy layer 104 extending down to a depth of about 1.2 µm to 1.7 µm.

The layer region 210 having the first conductive type dopants is disposed in the deep well region 106 and is, for example, a p type layer region. The layer region 210 is located above the layer region 204 and connected to the layer region 204 to connect the layer region 210 to the top surface of the epitaxy layer 104. In addition, the layer region 210 and the layer regions 208, 206 are, for example, unconnected. In the second embodiment, the dopants implanted in the p type doped region 210 are boron, with a doping concentration, for example, of about $5 \times 10^{16}$ atoms/cm$^3$ to $8 \times 10^{17}$ atoms/cm$^3$. In addition, the layer region 210 has a distribution range from the top surface of the epitaxy layer 104 extending down to a depth of about 1.0 µm to 2.0 µm. The distribution range can be modified for the best performance.

In the second embodiment, in the 3D point of view, three sides of the layer region 202 are, for example, in contact with the epitaxy layer 104, and three sides of the layer region 204 are, for example, in contact with the epitaxy layer 104. Additionally, the layer regions 206, 208 and the layer region 210 are not necessarily located on the same side. As long as three photodiodes are formed and connected to the top surface of the epitaxy layer 104, the scopes of the present invention are not limited to the examples described herein.

In FIG. 2, the layer region 202, the layer region 204, the layer region 206, the layer region 208 and/or the layer region 210 and/or the doped region 211 disposed in the deep well region 106 divide the deep well region 106 into a plurality of regions. There are a plurality of p-n junctions between these regions, and the photodiode structure having the multiple junctions is formed. Specifically speaking, for the semiconductor device 200, the deep well region 106 or the doped region 211 surrounded by the epitaxy layer 104, the layer region 204 and the layer region 210 forms the first photodiode, the L-shaped deep well region 106 surrounded by the layer region 202, the layer region 204, the layer region 206, the layer region 208, the layer region 210 and the epitaxy layer 104 forms the second photodiode, and the L-shaped deep well region 106 surrounded by the epitaxy layer 104, the layer region 202, the layer region 206 and the layer region 208 forms the third photodiode. Hence, the multi junction photodiode structure can detect light of various wavelength, thus achieving wavelength discrimination.

In addition, in order to increase the conductivity of the photodiode, within the deep well region 106 having the second conductive type dopants, it is optional to set the well region 212 and the well region 214 of the same conductive type. The doping concentrations of the well region 212 and the well region 214 are higher than that of the deep well region 106, so that the well region 212 and the well region 214 function as the terminals for outer connection for deep well region 106. The doped region 211 is, for example, an n type doped region and is disposed in the deep well region 106 above the layer region 204. That is, the doped region 211 is located within the range defined by the layer region 204 and the layer region 210. The well region 212 is, for example, an n type well region and is disposed in the deep well region 106 above the layer region 202 and between the layer region 208 and the layer region 210. The well region 214 is, for example, an n type well region. The well region 214 is disposed in the deep well region 106 defined by the layer regions 202, 206, 208 and the epitaxy layer 104 and between the layer region 208 and the well region 120. The dopants, the doping concentration, and the distribution coverage of the doped region 211 are, for example, similar to or the same as those of the doped region 114 in the first embodiment. The dopants, the doping concentration, and the distribution coverage of the well region 212 are, for example, similar to or the same as those of the well region 116 in the first embodiment. The dopants, the doping concentration, and the distribution coverage of the well region 214 are, for example, similar to or the same as those of the well region 118 in the first embodiment.

In the second embodiment, for the semiconductor device 200, it is optional to set the well region 120 having the first conductive type dopants, the well region 122 having the second conductive type dopants, and the doped region 124 having the first conductive type dopants, in order to block the leaking current path to reduce the dark current and improve the device performance. In addition, the semiconductor device 200 further includes a plurality of the contact 126, respectively disposed on the deep well region 106 (or the doped region 211) above the layer region 204, and on the well region 212, the well region 214, the well region 120 and the well region 122, for electrical connection to outer circuits. The modification and application based on the previous embodiments are well known to the artisans in this field and will not be explained in details herein.

Third Embodiment

Figure 3:
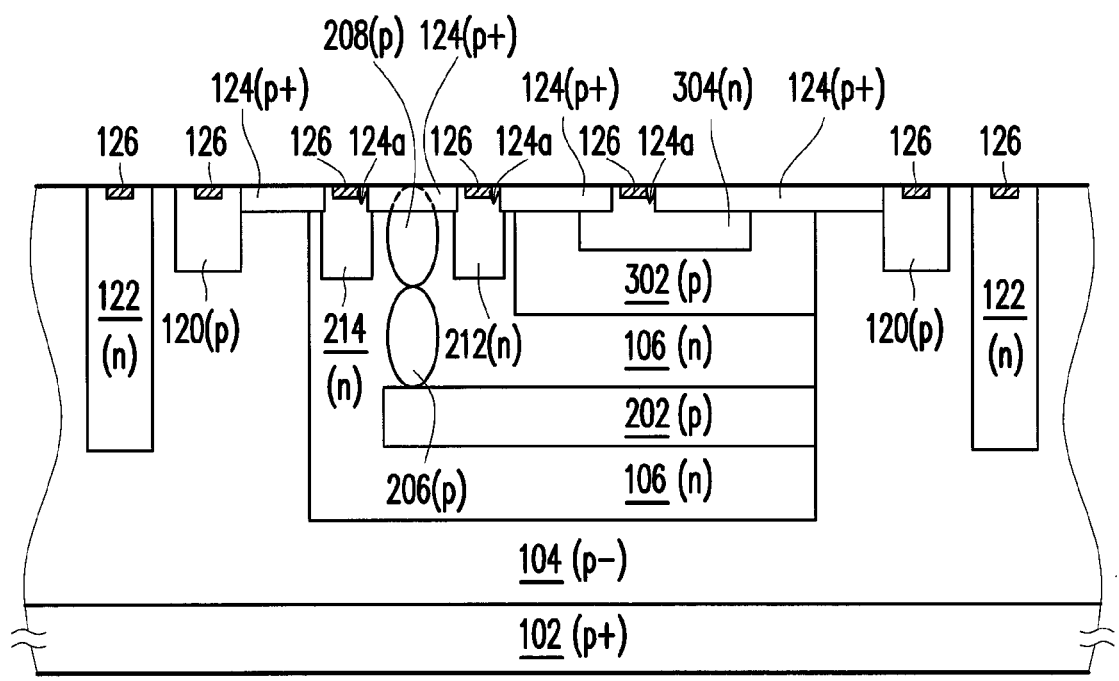
FIG. 3 is a schematic cross-sectional view of the semiconductor device of this invention according to the third embodiment.

FIG. 3 is a schematic cross-sectional view of the semiconductor device of this invention according to the third embodiment. In FIG. 3, the same elements used in FIG. 2 are designated with the same reference numbers and the detailed descriptions may be omitted.

Referring to FIG. 3, the semiconductor device 300 is, for example, a multi junction photodiode for detecting light of various wavelength. The main elements of the semiconductor device 300 of FIG. 3 are substantially similar to those elements of the semiconductor device 200 of FIG. 2, while the differences mainly lie in the arrangement of the photodiode. The semiconductor device 300 includes the substrate 102 having the first conductive type dopants, the epitaxy layer 104 having the first conductive type dopants, the deep well region 106 having the second conductive type dopants, the layer region 202 having the first conductive type dopants, the layer region 206 having the first conductive type dopants, the layer region 208 having the first conductive type dopants, the well region 302 having the first conductive type dopants and the doped region 304 having the second conductive type dopants.

The well region 302 having the first conductive type dopants is disposed in the deep well region 106 and is, for example, a p type well region. The well region 302 is located above the layer region 202, and the well region 302 is unconnected to the layer regions 202, 206, 208, for example. In the third embodiment, the dopants implanted in the p type well region 302 are boron, with a doping concentration, for example, of about $5 \times 10^{16}$ atoms/cm$^3$ to $8 \times 10^{17}$ atoms/cm$^3$. In addition, the well region 302 has a distribution range from the top surface of the epitaxy layer 104 extending down to a depth of about 1.2 µm to 1.7 µm.

The doped region 304 having the second conductive type dopants is disposed in the well region 302 and is, for example, an n type doped region. In the third embodiment, the dopants implanted in the n type doped region 304 are phosphorus, with a doping concentration, for example, of about $1 \times 10^{16}$ atoms/cm$^3$ to $1 \times 10^{17}$ atoms/cm$^3$. In addition, the doped region 304 has a distribution range from the top surface of the epitaxy layer 104 extending down to a depth of about 0.5 µm to 0.8 µm.

In the third embodiment, in the 3D point of view, three sides of the layer region 202 are, for example, in contact with the epitaxy layer 104, and three sides of the well region 302 are, for example, in contact with the epitaxy layer 104. In FIG. 3, because of the formation of the layer region 202, the layer region 206, the layer region 208, the well region 302 and the doped region 304 in the deep well region 106, there are plural p-n junctions between these regions and the multi junction photodiode is formed. Specifically speaking, for the semiconductor device 300, the doped region 304 surrounded by the well region 302 forms the first photodiode, the L-shaped deep well region 106 that is surrounded by the layer region 202, the layer region 206, the layer region 208, the well region 302 and the epitaxy layer 104 forms the second photodiode, and the L-shaped deep well region 106 that is surrounded by the epitaxy layer 104, the layer region 202, the layer region 206 and the layer region 208 forms the third photodiode. Hence, the multi junction photodiode structure can detect light of various wavelength, thus achieving wavelength discrimination.

In addition, the semiconductor device 300 further includes a plurality of the contact 126, respectively disposed on the doped region 304, the well region 212, the well region 214, the well region 120 and the well region 122 上, for electrically connected to the outer circuits.

The semiconductor devices 100, 200, 300 described in the first, second and third embodiments are multi junction photodiodes, which are able to detect light of multiple wavelength and widely applicable for various detection. For example, based on the biochemical standards of single-molecule sequencing of genome, the sensor is required to have the sensitivity of detecting less than 300 photons within the integrated time (≤33 ms) for single-molecule sequencing of genome. The multi junction photodiode is required to have low dark current and high sensitivity. The multi junction photodiode of this invention fulfills such requirements, and the assorting capability of multiple wavelength can be employed for single-molecule fluorescence detection of biochemical reactions. However, the applications of the device of this invention are not limited to the embodiments.

The fabrication processes for the semiconductor devices 100, 200, 300 as shown in FIGS. 1B, 2 and 3 are described as follows. However, as the artisan would understand, the fabrication processes provided herein are used to describe the manufacturing of the semiconductor device of this invention compatible with the current CMOS logic processes, but are not meant to limit the scopes of the present invention. The fabrication processes for the semiconductor devices are not limited to the sequence of the steps described in the embodiments and modifications can be made according to the technology or product requirements.

Fourth Embodiment

Figure 4A:
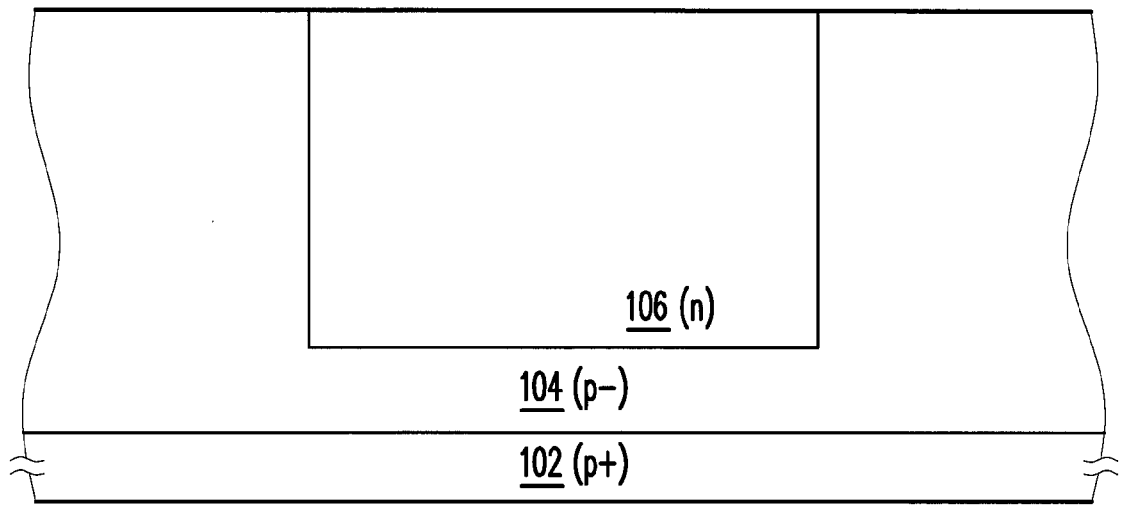
FIGS. 4A-4C are schematic cross-sectional view showing the manufacturing process steps for the semiconductor device of this invention according to the fourth embodiment.
Figure 4B:
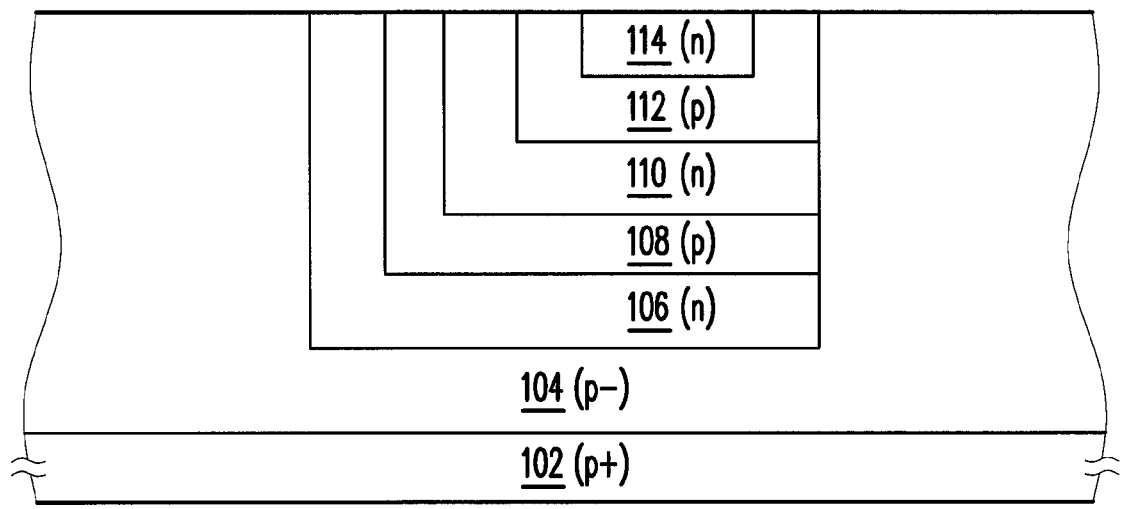
Figure 4C:
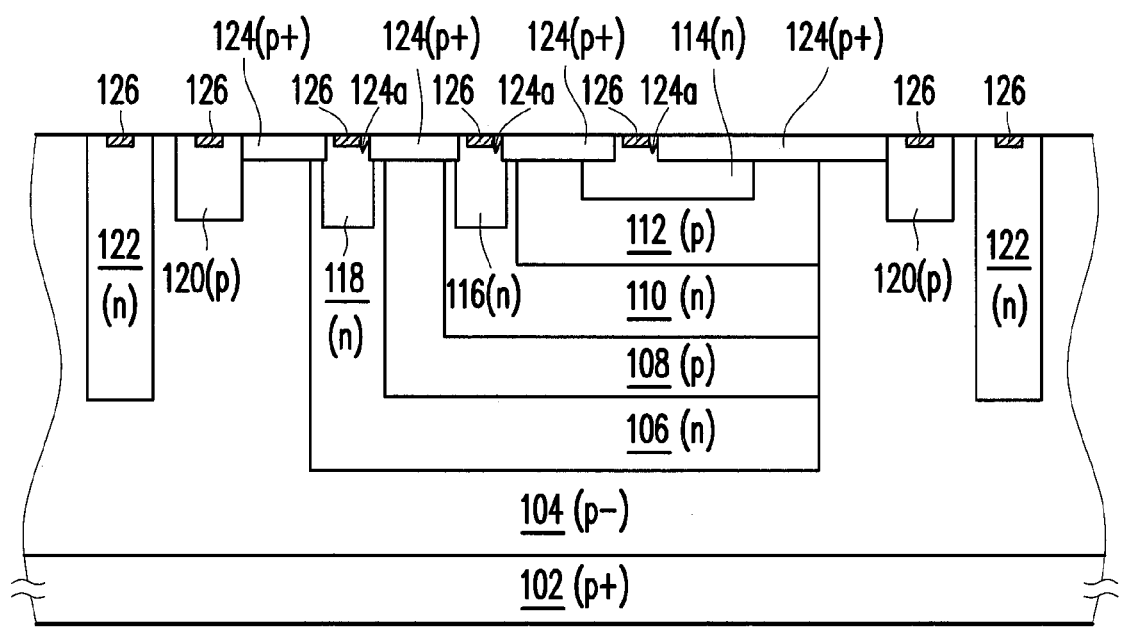
Figure 7:
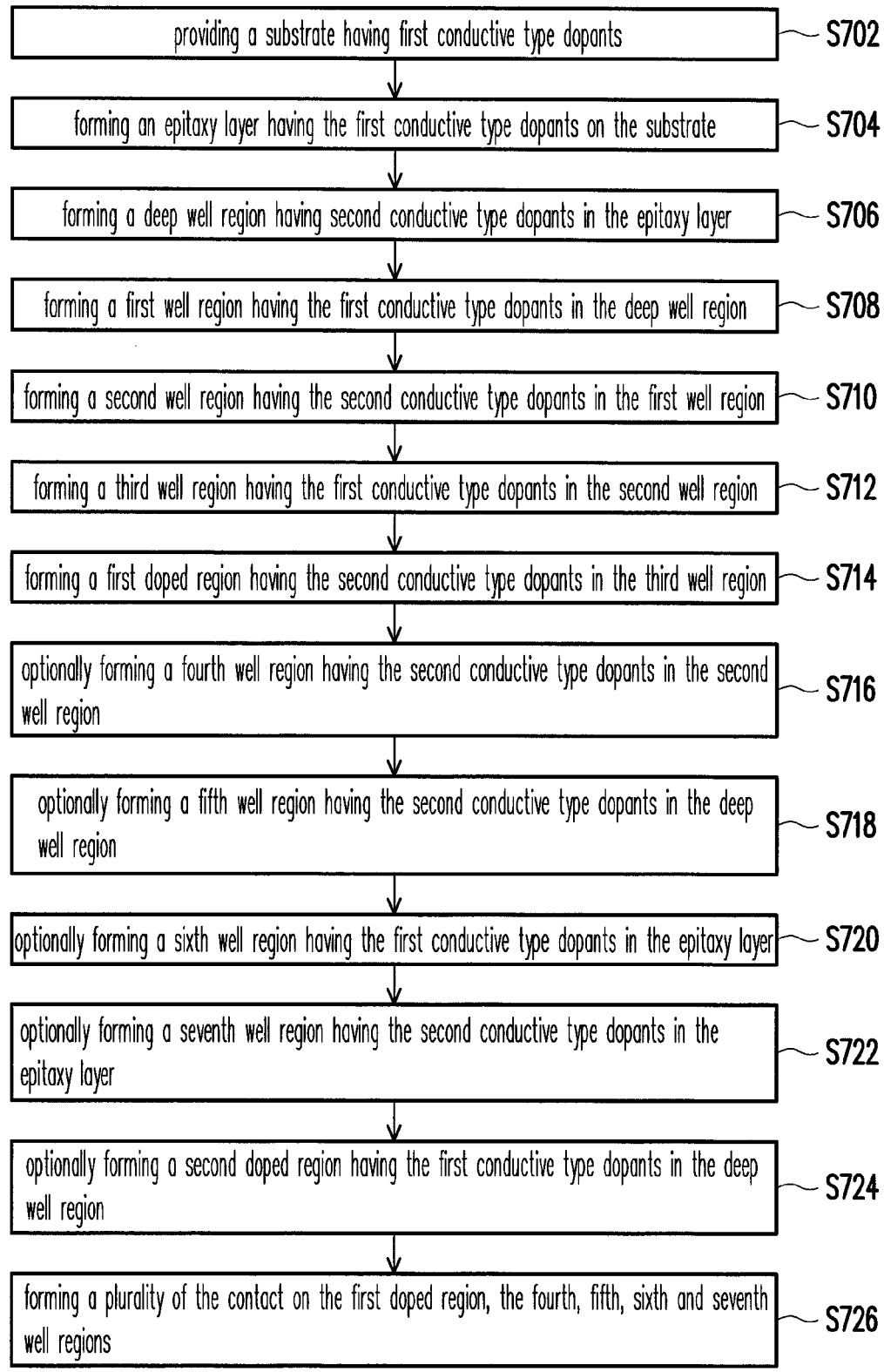
FIG. 7 is the flow chart of the manufacturing process steps for the semiconductor device of this invention according to the fourth embodiment.

FIGS. 4A-4C are schematic cross-sectional view showing the fabrication process steps for the semiconductor device of this invention according to the fourth embodiment. In FIGS. 4A to 4C, the same elements used in FIG. 1B are designated with the same reference numbers and the detailed descriptions may be omitted. FIG. 7 is the flow chart of the fabrication process steps for the semiconductor device of this invention according to the fourth embodiment.

Referring to FIGS. 4A and 7, in Step S702, the substrate 102 having the first conductive type dopants is provided and the substrate 102 is, for example, a p+ type silicon substrate or other semiconductor substrate. In Step S704, the epitaxy layer 104 having the first conductive type dopants is formed on the substrate 102 and is, for example, a p type lightly boron doped epitaxy layer. The epitaxy layer 104 can be formed by the epitaxy process to form an epitaxy silicon layer on the surface of the substrate 102. In Step S706, the deep well region 106 having the second conductive type dopants is formed in the epitaxy layer 104 and is, for example, an n type deep well region. In the fourth embodiment, the deep well region 106 can be formed in the epitaxy layer 104 through one or more phosphorus ion implantation process with an implantation energy, for example, of about 1600 keV to 2200 keV.

Referring to FIGS. 4B and 7, in Step S708, the well region 108 having the first conductive type dopants is formed in the deep well region 106 and is, for example, a p type well region. In the fourth embodiment, boron ions are implanted through one or more ion implantation process into the deep well region 106 to form the well region 108 with an implantation energy, for example, of about 1050 keV to 1600 keV. In Step S710, the well region 110 having the second conductive type dopants is formed in the well region 108 and is, for example, an n type well region. In the fourth embodiment, phosphorus ions are implanted through one or more ion implantation process into the well region 108 to form the well region 110 with an implantation energy, for example, of about 1400 keV to 2000 keV.

In Step S712, the well region 112 having the first conductive type dopants is formed in the well region 110 and is, for example, a p type well region. In the fourth embodiment, boron ions are implanted through one or more ion implantation process into the well region 110 to form the well region 112 with an implantation energy, for example, of about 300 keV to 550 keV. In Step S714, the doped region 114 having the second conductive type dopants is formed in the well region 112 and is, for example, an n type doped region. In the fourth embodiment, phosphorus ions are implanted by ion implantation into the upper part of the well region 112 to form the doped region 114 with an implantation energy, for example, of about 200 keV to 500 keV.

Referring to FIGS. 4C and 7, it is optional to form the well region 116 having the second conductive type dopants in the well region 110 (Step S716), and to form the well region 118 having the second conductive type dopants in the deep well region 106 (Step S718). The well region 116 and the well region 118 are, for example, the n type well regions of higher doping concentrations, respectively functioning as the terminals of the well region 110 and the well region 106 for outer connections. In the fourth embodiment, phosphorus ions are implanted by ion implantation into upper parts of the well region 110 and the deep well region 106 to respectively form the well region 116 and the well region 118 with an implantation energy, for example, of about 200 keV to 500 keV. In addition, the well region 116 and the well region 118 can be formed in the same step or separately in different steps.

Later, it is optional to form the well region 120 having the first conductive type dopants (Step S720) and the well region 122 having the second conductive type dopants (Step S722) in the epitaxy layer 104, and to form the doped region 124 having the first conductive type dopants (Step S724) in the deep well region 106. The well region 120 is, for example, the p type well region, and is ring-shaped surrounding the deep well region 106. In the fourth embodiment, boron ions are implanted by ion implantation into upper parts of the epitaxy layer 104 and outside the deep well region 106 to form the well region 120 with an implantation energy, for example, of about 250 keV to 350 keV. The well region 122 is, for example, on n type well region and is ring-shaped surrounding the well region 120. In the fourth embodiment, phosphorus ions are implanted by ion implantation into the upper part of the epitaxy layer 104 and outside the well region 120 to form the well region 122 with an implantation energy, for example, of about 350 keV to 550 keV. The doped region 124 is, for example, a p type doped region and is formed within the range defined by the ring-shaped well region 120 and spans over the upper part of the whole deep well region 106. In the fourth embodiment, boron ions are implanted by ion implantation into the upper part of the deep well region 106 to form the doped region 124 with an implantation energy, for example, of about 10 keV to 45 keV.

Step S726, a plurality of contact 126 is formed in the doped region 114, the well region 116, the well region 118, the well region 120, and the well region 122, for electrically connecting to the outer circuits. Thus, the semiconductor device 100 as shown in FIGS. 1A and 1B is obtained.

Fifth Embodiment

Figure 5A:
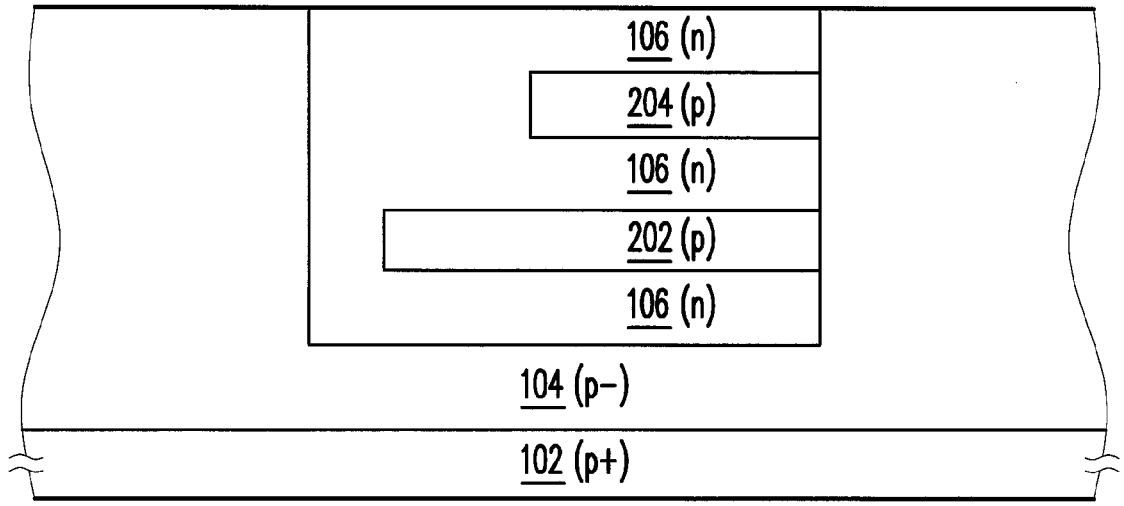
FIGS. 5A-5C are schematic cross-sectional view showing the manufacturing process steps for the semiconductor device of this invention according to the fifth embodiment.
Figure 5B:
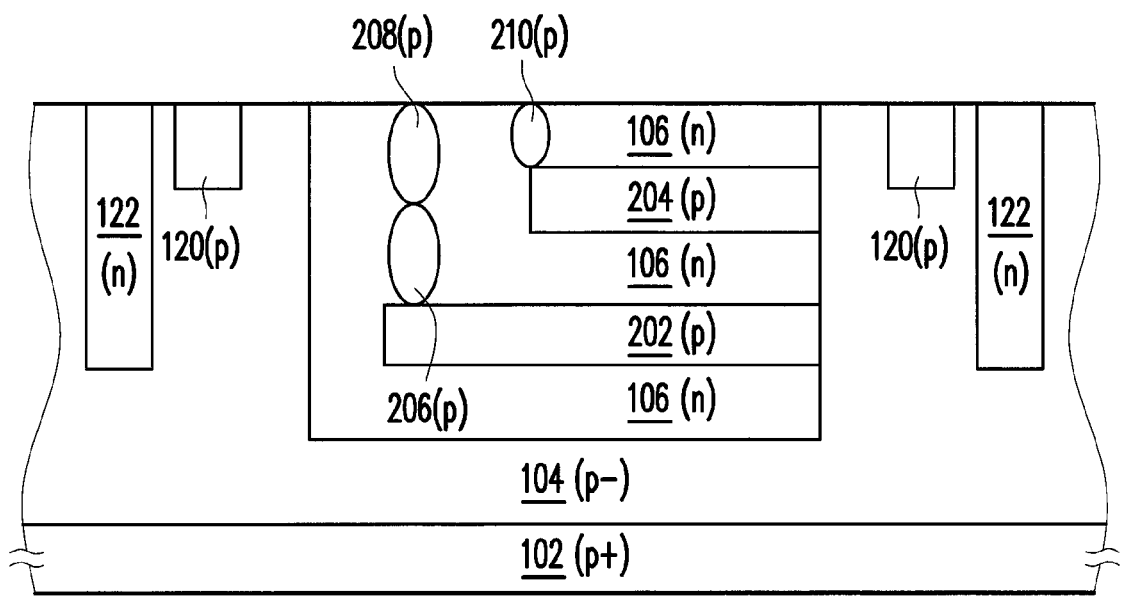
Figure 5C:
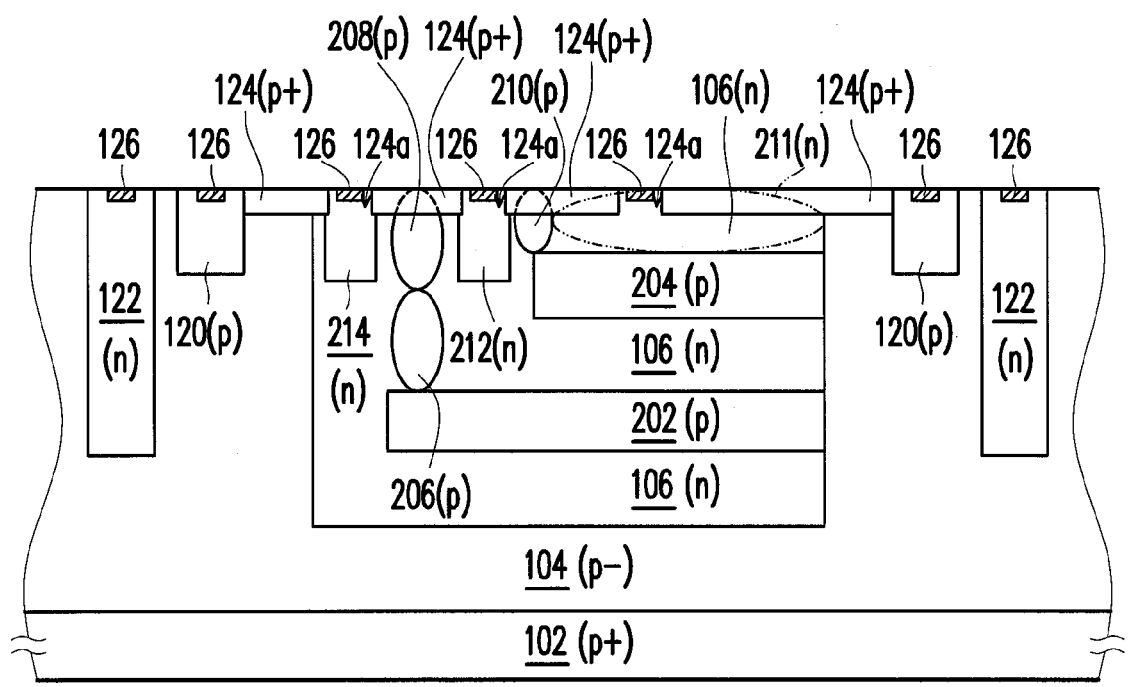
Figure 8:
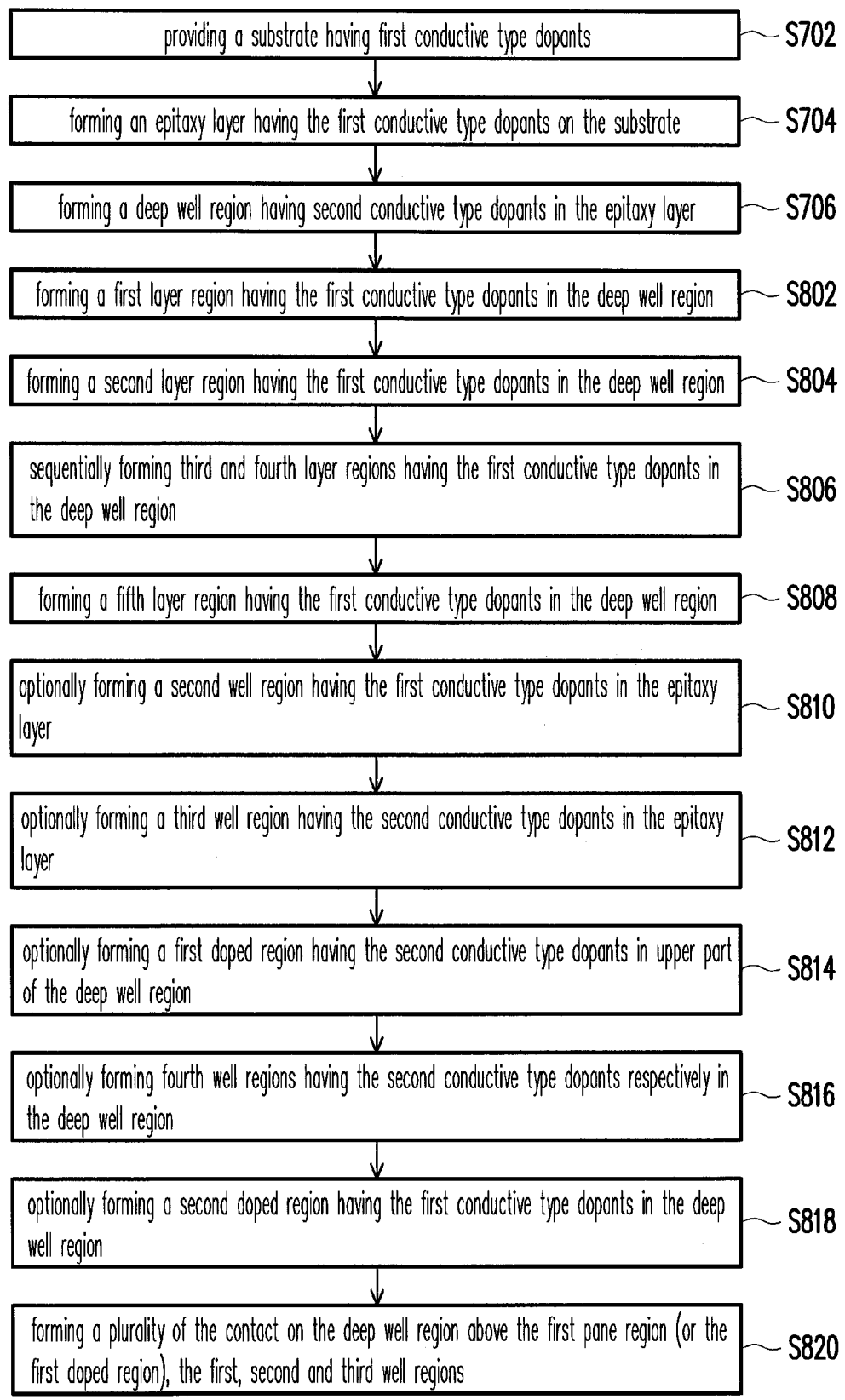
FIG. 8 is the flow chart of the manufacturing process steps for the semiconductor device of this invention according to the fifth embodiment.

FIGS. 5A to 5C are schematic cross-sectional view showing the fabrication process steps for the semiconductor device of this invention according to the fifth embodiment. In FIGS. 5A to 5C, the same elements used in FIG. 2 are designated with the same reference numbers, and the detailed descriptions may be omitted. FIG. 8 is the flow chart of the fabrication process steps for the semiconductor device of this invention according to the fifth embodiment.

Referring to FIGS. 5A and 8, after the formation of the deep well region 106 (Step S706), Step S802 is followed. The layer region 202 having the first conductive type dopants is formed in the deep well region 106. The layer region 202, is, for example, a p type well region. In the fifth embodiment, boron ions are implanted into the deep well region 106 to form the layer region 202 with an implantation energy, for example, of about 1050 keV to 1600 keV. Step S804, the layer region 204 having the first conductive type dopants is formed in the deep well region 106 and is, for example, a p type well region. It is noted that the layer region 202 and the layer region 204 in the deep well region 106 do not reach the upper surface of the epitaxy layer 104, and the layer region 204 and the below layer region 202 are unconnected to each other. In the fifth embodiment, boron ions are implanted by ion implantation into the deep well region 106 to form the layer region 204 with an implantation energy, for example, of about 300 keV~550 keV.

Referring to FIGS. 5B and 8, in Step S806, the layer region 206 and the layer region 208 having the first conductive type dopants are sequentially formed in the deep well region 106. The layer region 206 and the layer region 208 having the first conductive type dopants are, for example, p type layer regions. The layer region 206 and the layer region 208 are, for example, vertical to and above the layer region 202, and the layer region 206 and the layer region 208 are connected to each other. Hence, the layer region 202 is connected to the top surface of the epitaxy layer 104 through the layer region 208 and the layer region 206. In the fifth embodiment, boron ions are implanted into the deep well region 106 to sequentially form the layer region 206 and the layer region 208 with an implantation energy, for example, of about 300 keV to 900 keV.

In Step S808, the layer region 210 having the first conductive type dopants is formed in the deep well region 106 and is, for example, a p type layer region. The layer region 210 is, for example, formed above and connected to the layer region 204, so that the layer region 204 is connected to the top surface of the epitaxy layer 104 through the layer region 210. In the fifth embodiment, boron ions are implanted into the deep well region 106 to form the layer region 210 with an implantation energy, for example, of about 300 keV to 500 keV. Later, it is optional to form the well region 120 having the first conductive type dopants (Step S810) and the well region 122 having the second conductive type dopants (Step S812) in the epitaxy layer 104. The well region 120 is, for example, a p type well region and is ring-shaped surrounding the deep well region 106. The well region 122 is, for example, an n type well region and is ring-shaped surrounding the well region 120. The well region 120 and the well region 122 can be formed according to the afore-mentioned steps and will not be detailed herein.

Referring to FIGS. 5C and 8, in Step S814, it is optional to form the doped region 211 having the second conductive type dopants in the upper part of the deep well region 106. The doped region 211 is, for example, an n type doped region of a higher doping concentration for better design flexibility. The doped region 211 is located within the range define by the layer region 204 and the layer region 210, for example. In Step S816, it is optional to form the well region 212 and the well region 214 having the second conductive type dopants in the deep well region 106. The well region 212 and the well region 214 are, for example, n type well regions of higher doping concentrations to increase conductivity as the terminals of the deep well region 106 for outer connections. The well region 212 is, for example, located above the layer region 202 and between the layer region 208 and the layer region 210. The well region 214 is, for example, located within the area defined by the layer regions 202, 206, 208 and the epitaxy layer 104, and located between the layer region 208 and the well region 120. In the fifth embodiment, phosphorus ions are implanted by ion implantation into the upper part of the deep well region 106 to form the well region 212 and the well region 214 with an implantation energy, for example, of about 200 keV to 500 keV. The well region 212 and the well region 214 can be formed in the same step or separately in different steps.

Later, after optional formation of the doped region 124 having the first conductive type dopants in the deep well region 106 (Step S818), Step S820 is performed to form a plurality of contacts 126 on the deep well region 106 that is above the layer region 204 (i.e. the doped region 211), the well region 212, the well region 214, the well region 120 and the well region 122. The semiconductor device 200 as shown in FIG. 2 is obtained.

Sixth Embodiment

Figure 6A:
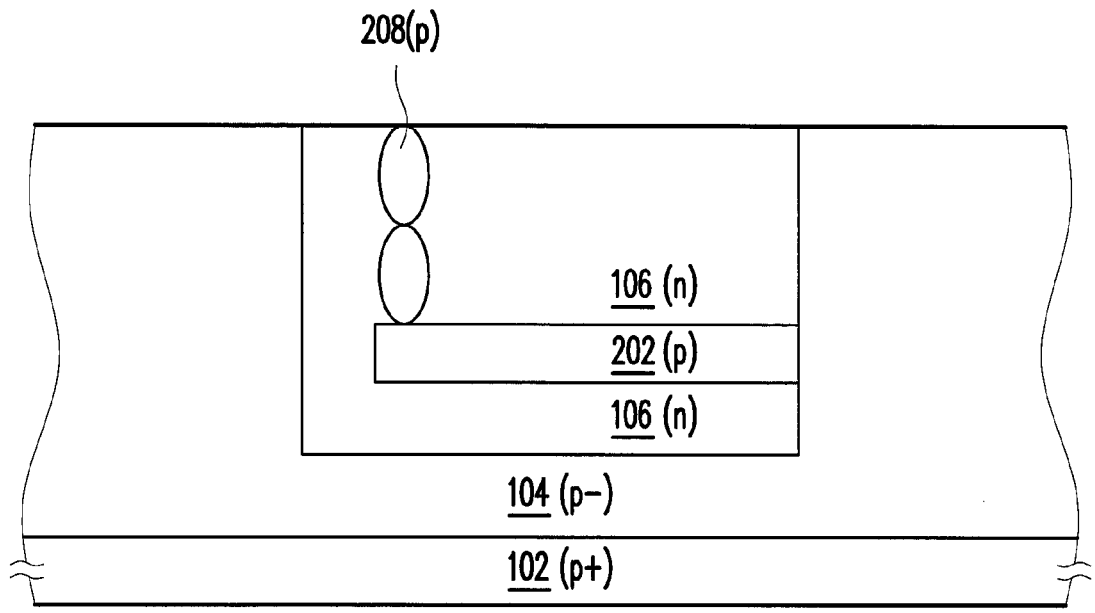
FIGS. 6A-6C are schematic cross-sectional view showing the manufacturing process steps for the semiconductor device of this invention according to the sixth embodiment.
Figure 6B:
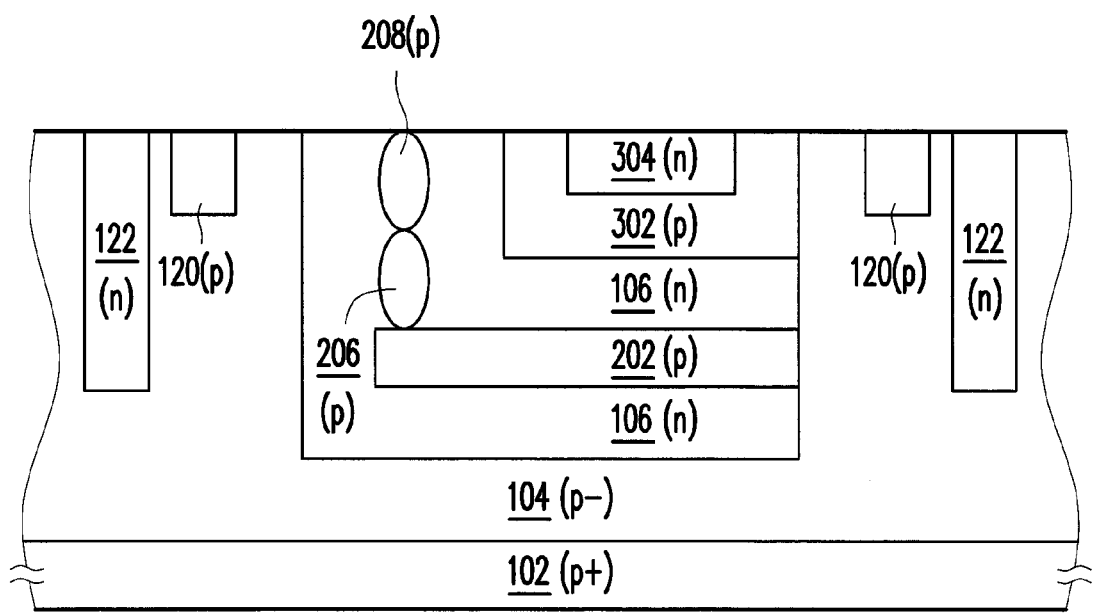
Figure 6C:
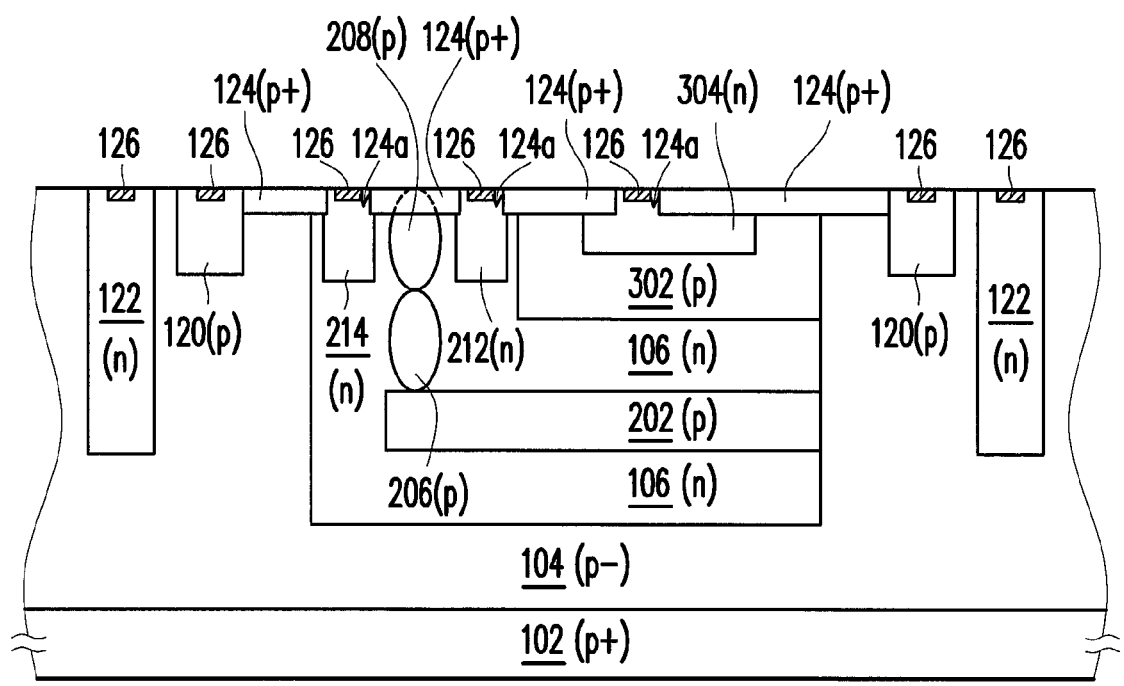
Figure 9:
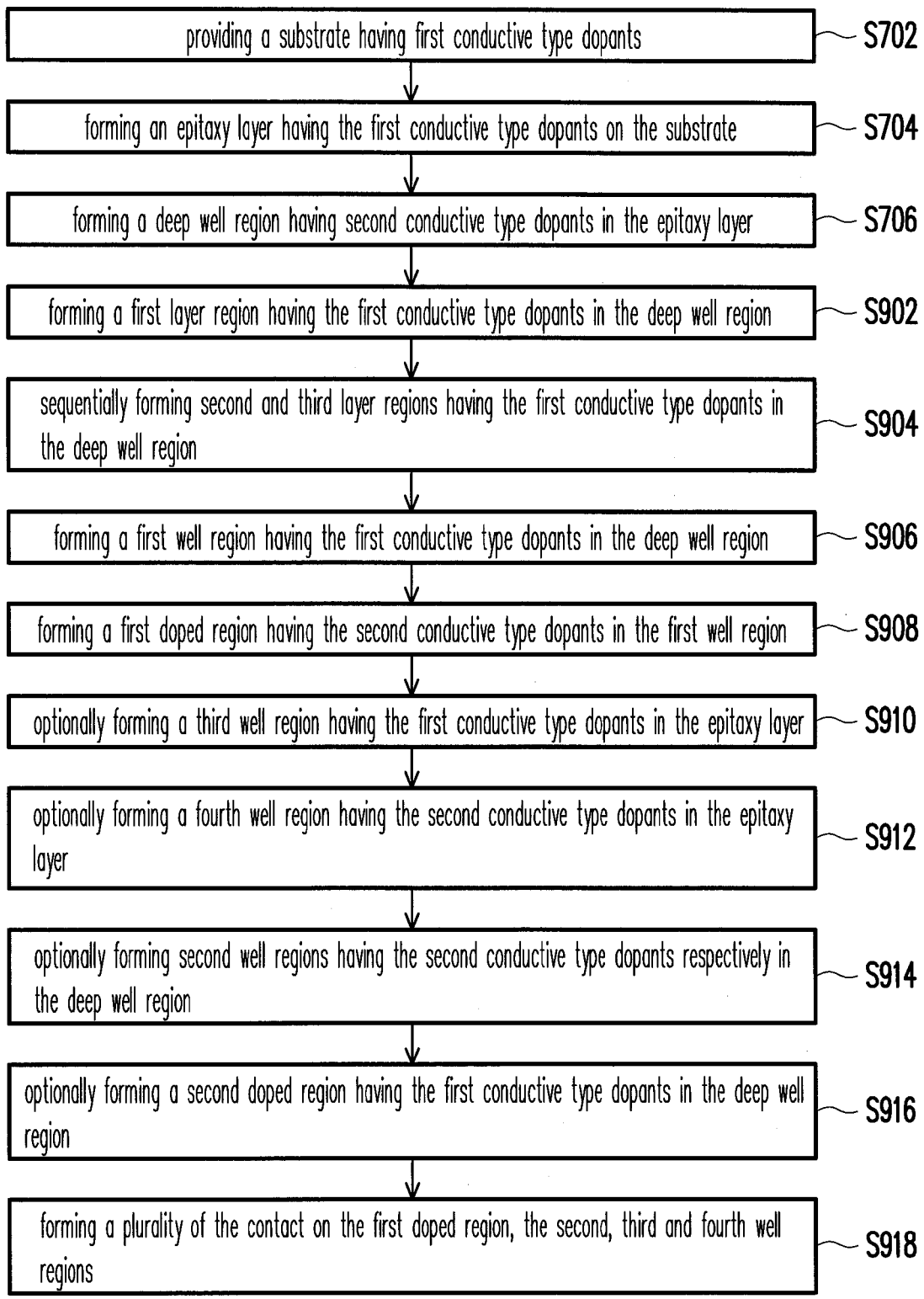
FIG. 9 is the flow chart of the manufacturing process steps for the semiconductor device of this invention according to the sixth embodiment.

FIGS. 6A-6C are schematic cross-sectional view showing the fabrication process steps for the semiconductor device of this invention according to the sixth embodiment. In FIGS. 6A to 6C, the same elements used in FIG. 3 are designated with the same reference numbers and the detailed descriptions may be omitted. FIG. 6A shows the process steps following the steps of FIG. 4A in the fourth embodiment. FIG. 9 is the flow chart of the fabrication process steps for the semiconductor device of this invention according to the sixth embodiment.

Referring to FIGS. 6A and 9, after formation of the deep well region 106 (Step S706), Step S902 is performed to form the layer region 202 having the first conductive type dopants in the deep well region 106. The layer region 202, is, for example, the p type layer region. In Step S904, the layer region 206 and the layer region 208 having the first conductive type dopants are sequentially formed in the deep well region 106. The layer region 206 and the layer region 208 are, for example, p type well regions. The layer region 206 and the layer region 208 are vertical to and above the layer region 202, for example, so that the layer region 202 is connected to the top surface of the epitaxy layer 104 through the upright structure of the layer region 208 and the layer region 206.

Referring to FIGS. 6B and 9, in Step S906, the well region 302 having the first conductive type dopants is formed in the deep well region 106. The well region 302, is, for example, a p type well region. The well region 302 in the deep well region 106 is located above the layer region 202 and reaches to the top surface of the epitaxy layer 104. In the sixth embodiment, boron ions are implanted into the deep well region 106 to form the well region 302 with an implantation energy, for example, of about 300 keV to 550 keV. In Step S908, the doped region 304 having the second conductive type dopants is formed in the well region 302 and is, for example, an n type doped region. In the sixth embodiment, phosphorus ions are implanted by ion implantation into the upper part of the well region 302 to form the doped region 304 with an implantation energy, for example, of about 200 keV to 500 keV. Later, the well region 120 having the first conductive type dopants (Step S910) and the well region 122 having the second conductive type dopants (S912) are optionally formed in the epitaxy layer 104. The well region 120 and the well region 122 can be formed according to the afore-mentioned steps and will not be detailed herein.

Referring to FIGS. 6C and 9, in Step S914, it is optional to form the well region 212 and the well region 214 having the second conductive type dopants in the deep well region 106. The well region 212 and the well region 214 are, for example, n type well regions of higher doping concentrations to increase conductivity, as terminals of the deep well region 106 for outer connections. The well region 212 is, for example, located above the layer region 202 and between the layer region 208 and the well region 302. The well region 214 is, for example, located within the area defined by the layer regions 202, 206, 208 and the epitaxy layer 104 and between the layer region 208 and the well region 120.

Later, after optional formation of the doped region 124 having the first conductive type dopants in the deep well region 106 (Step S916), Step S918 is performed to form a plurality of the contacts 126 on the doped region 304, the well region 212, the well region 214, the well region 120 and the well region 122. The semiconductor device 300 as shown in FIG. 3 is obtained.

It is noted that several ion implantation processes are employed according to the fourth, fifth and sixth embodiments to implant the dopants into the epitaxy layer 102 to form the multi junction photodiode, which is able to detect light of various wavelength. The ion implantation processes can be accomplished by the CMOS logic processes and are compatible with the current semiconductor processes in mask layout. However, the above fabrication processes are not limited to the CMOS logic processes and the sequence of the process steps can be modified.

In conclusion, by arranging the well regions, the layer regions and the doped regions in the epitaxy layer, the multi junction photodiode(s) is formed in the semiconductor device of this invention, thus offering wavelength discrimination. In addition, the semiconductor device of this invention can provide low dark current and high sensitivity for various detection applications.

Furthermore, the fabrication processes of the semiconductor device of this invention can be integrated with the current CMOS logic processes, so that the multi junction photodiodes can be formed with the CMOS logic devices at the same time, thus simplifying the fabrication without increasing the production costs.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not be necessarily being drawn to scale. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
a substrate having first conductive type dopants;
an epitaxy layer having the first conductive type dopants, disposed on the substrate;
a deep well region having second conductive type dopants, disposed in the epitaxy layer;
a first well region having the first conductive type dopants, disposed in the deep well region, and three sides of the first well region are in contact with the epitaxy layer;
a second well region having the second conductive type dopants, disposed in the first well region;
a third well region having the first conductive type dopants, disposed in the second well region, and three sides of the third well region are in direct contact with the epitaxy layer; and a first doped region having the second conductive type dopants, disposed in the third well region.

2. The semiconductor device of claim 1, further comprising a fourth well region having the second conductive type dopants disposed in the second well region, wherein the fourth well region has a doping concentration larger than that of the second well region.

3. The semiconductor device of claim 1, further comprising a fifth well region having the second conductive type dopants disposed in the deep well region, wherein the fifth well region has a doping concentration larger than that of the deep well region.

4. The semiconductor device of claim 1, further comprising a sixth well region having the first conductive type dopants disposed in the epitaxy layer and outside an edge of the deep well region.

5. The semiconductor device of claim 4, further comprising a seventh well region having the second conductive type dopants disposed in the epitaxy layer and outside an edge of the sixth well region.

6. The semiconductor device of claim 1, further comprising a second doped region having the first conductive type dopants disposed in an upper part of the deep well region.

7. The semiconductor device of claim 1, wherein when the first conductive type dopants are p type, the second conductive type dopants are n type; when the first conductive type dopants are n type, the second conductive type dopants are p type.

8. A semiconductor device, comprising:
a substrate having first conductive type dopants;
an epitaxy layer having the first conductive type dopants, disposed on the substrate;
a deep well region having second conductive type dopants, disposed in the epitaxy layer;
a first layer region and a second layer region having the first conductive type dopants, disposed in the deep well region, and three sides of the first layer region and three sides of the second layer region are respectively in direct contact with the epitaxy layer, wherein the second layer region is located above and unconnected to the first layer region;
at least a third layer region having the first conductive type dopants, disposed in the deep well region, wherein the third layer region is located above the first layer region to connect the first layer region to a top surface of the epitaxy layer; and
a fourth layer region having the first conductive type dopants, disposed in the deep well region, wherein the fourth layer region is located above the second layer region to connect the second layer region to the top surface of the epitaxy layer.

9. The semiconductor device of claim 8, further comprising a first doped region having the second conductive type dopants disposed in the deep well region, wherein the first doped region is located above the second layer region and the first doped region has a doping concentration larger than that of the deep well region.

10. The semiconductor device of claim 8, further comprising at least a first well region having the second conductive type dopants disposed in the deep well region, wherein the first well region has a doping concentration larger than that of the deep well region.

11. The semiconductor device of claim 8, further comprising a second well region having the first conductive type dopants disposed in the epitaxy layer and outside an edge of the deep well region.

12. The semiconductor device of claim 11, further comprising a third well region having the second conductive type dopants, disposed in the epitaxy layer and outside an edge of the second well region.

13. The semiconductor device of claim 8, further comprising a second doped region having the first conductive type dopants disposed in an upper part of the deep well region.

14. The semiconductor device of claim 8, wherein when the first conductive type dopants are p type, the second conductive type dopants are n type; when the first conductive type dopants are n type, the second conductive type dopants are p type.

15. A semiconductor device, comprising:
a substrate having first conductive type dopants;
an epitaxy layer having the first conductive type dopants, disposed on the substrate;
a deep well region having second conductive type dopants, disposed in the epitaxy layer;
a first layer region having the first conductive type dopants, disposed in the deep well region, and three sides of the first layer region are in direct contact with the epitaxy layer;
at least a second layer region having the first conductive type dopants, disposed in the deep well region, wherein the second layer region is located above the first layer region to connect the first layer region to a top surface of the epitaxy layer;
a first well region having the first conductive type dopants, disposed in the deep well region, wherein the first well region is located above and unconnected to the first layer region, and three sides of the first well region are in direct contact with the epitaxy layer; and
a first doped region having the second conductive type dopants, disposed in the first well region.

16. The semiconductor device of claim 15, further comprising at least a second well region having the second conductive type dopants disposed in the deep well region, wherein the second well region has a doping concentration larger than that of the deep well region.

17. The semiconductor device of claim 15, further comprising a third well region having the first conductive type dopants disposed in the epitaxy layer and outside an edge of the deep well region.

18. The semiconductor device of claim 17, further comprising a fourth well region having the second conductive type dopants, disposed in the epitaxy layer and outside an edge of the third well region.

19. The semiconductor device of claim 15, further comprising a second doped region having the first conductive type dopants disposed in an upper part of the deep well region.

20. The semiconductor device of claim 15, wherein when the first conductive type dopants are p type, the second conductive type dopants are n type; when the first conductive type dopants are n type, the second conductive type dopants are p type.

21. A fabrication method of a semiconductor device, comprising:
providing a substrate having first conductive type dopants;
forming an epitaxy layer having the first conductive type dopants on the substrate;
forming a deep well region having second conductive type dopants in the epitaxy layer;
forming a first well region having the first conductive type dopants in the deep well region, wherein three sides of the first well region are in direct contact with the epitaxy layer;

forming a second well region having the second conductive type dopants in the first well region;

forming a third well region having the first conductive type dopants in the second well region, wherein three sides of the third well region are in direct contact with the epitaxy layer; and forming a first doped region having the second conductive type dopants in the third well region.

22. The method of claim 21, wherein when the first conductive type dopants are p type, the second conductive type dopants are n type; when the first conductive type dopants are n type, the second conductive type dopants are p type.

23. A fabrication method of a semiconductor device, comprising:

providing a substrate having first conductive type dopants;

forming an epitaxy layer having the first conductive type dopants on the substrate;

forming a deep well region having second conductive type dopants in the epitaxy layer;

forming a first layer region and a second layer region having the first conductive type dopants in the deep well region, wherein the second layer region is formed above and unconnected with the first layer region, three sides of the first layer region and three sides of the second layer region are respectively in direct contact with the epitaxy layer;

forming at least a third layer region having the first conductive type dopants in the deep well region, wherein the third layer region is formed above the first layer region to connect the first layer region to the top surface of the epitaxy layer; and forming a fourth layer region having the first conductive type dopants in the deep well region, wherein the fourth layer region is formed above the second layer region to connect the second layer region to a top surface of the epitaxy layer.

24. The method of claim 23, wherein when the first conductive type dopants are p type, the second conductive type dopants are n type; when the first conductive type dopants are n type, the second conductive type dopants are p type.

25. A fabrication method of a semiconductor device, comprising:

providing a substrate having first conductive type dopants;

forming an epitaxy layer having the first conductive type dopants on the substrate;

forming a deep well region having second conductive type dopants in the epitaxy layer;

forming a first layer region having the first conductive type dopants in the deep well region, wherein three sides of the first layer region are in direct contact with the epitaxy layer;

forming at least a second layer region having the first conductive type dopants in the deep well region, wherein the second layer region is formed above the first layer region to connect the first layer region to a top surface of the epitaxy layer;

forming a first well region having the first conductive type dopants in the deep well region, wherein the first well region is formed above and unconnected with the first layer region, and three sides of the first well region are in direct contact with the epitaxy layer; and forming a first doped region having the second conductive type dopants in the first well region.

26. The method of claim 25, wherein when the first conductive type dopants are p type, the second conductive type dopants are n type; when the first conductive type dopants are n type, the second conductive type dopants are p type.

* * * * *